(12) United States Patent
Skorjanec et al.

(10) Patent No.: US 11,603,969 B2
(45) Date of Patent: Mar. 14, 2023

(54) INTERACTIVE POWER DISTRIBUTION UNITS (PDUS) AND RELATED SYSTEMS

(71) Applicant: Eaton Intelligent Power Limited, Dublin (IE)

(72) Inventors: Joseph B. Skorjanec, Sioux Falls, SD (US); Josiah D. Smith, Mission Viejo, CA (US); Sebastien Ocquidant, Grenoble (FR); Fabrice Serrano, Saint Bernard du Touvet (FR)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 17/011,656

(22) Filed: Sep. 3, 2020

(65) Prior Publication Data
US 2021/0071831 A1  Mar. 11, 2021

Related U.S. Application Data

(60) Provisional application No. 62/896,025, filed on Sep. 5, 2019.

(51) Int. Cl.
*F21S 4/28* (2016.01)
*F21Y 103/10* (2016.01)
*F21Y 115/10* (2016.01)
*G06F 1/26* (2006.01)

(52) U.S. Cl.
CPC .............. *F21S 4/28* (2016.01); *F21Y 2103/10* (2016.08); *F21Y 2115/10* (2016.08); *G06F 1/266* (2013.01)

(58) Field of Classification Search
CPC .... F21S 4/28; G06F 1/266; G06F 1/28; G06F 16/532; F21Y 2103/10; F21Y 2115/10; G06K 2209/03; G06K 9/00771; H01R 13/7175; H05K 7/1492; G06V 2201/02; G06V 20/52; F21V 33/00
See application file for complete search history.

(56) References Cited

U.S. PATENT DOCUMENTS

| | | | |
|---|---|---|---|
| 10,333,259 B1* | 6/2019 | Kuo | H01R 13/665 |
| 2008/0204268 A1 | 8/2008 | Dowling et al. | |
| 2009/0236909 A1* | 9/2009 | Aldag | H01R 25/142 340/654 |

(Continued)

FOREIGN PATENT DOCUMENTS

| | | | | |
|---|---|---|---|---|
| CN | 106569571 A | * | 4/2017 | G06F 1/26 |
| WO | WO 2016/209875 A1 | | 12/2016 | |
| WO | WO-2019023731 A1 | * | 2/2019 | H02M 3/315 |

OTHER PUBLICATIONS

Yann Serra, "LeMagIT.com, Thanks to the Edge, Schneider Electric wants to become an IT big," Tech Target, Oct. 4, 2019, 4 pages.

(Continued)

*Primary Examiner* — Jong-Suk (James) Lee
*Assistant Examiner* — Glenn D Zimmerman
(74) *Attorney, Agent, or Firm* — Stanek Lemon Crouse & Meeks, PA

(57) ABSTRACT

A power distribution unit (PDU) is provided including a plurality of outlets; and a plurality of light emitting diodes (LEDs) associated with a corresponding one of the plurality of outlets. Each of the plurality of LEDs being configured to produce a plurality of colors and each of the plurality of colors being uniquely associated with different properties of the PDU.

17 Claims, 7 Drawing Sheets

(56) References Cited

U.S. PATENT DOCUMENTS

| | | | | |
|---|---|---|---|---|
| 2009/0242265 | A1* | 10/2009 | Doorhy | H05K 7/1457 |
| | | | | 174/494 |
| 2014/0329467 | A1* | 11/2014 | Ewing | H04W 4/80 |
| | | | | 455/41.2 |
| 2015/0316589 | A1* | 11/2015 | Mazara Diaz | G01R 19/165 |
| | | | | 324/114 |
| 2016/0095247 | A1* | 3/2016 | Rohr | H04Q 1/09 |
| | | | | 362/382 |
| 2016/0225246 | A1* | 8/2016 | Huang | H01R 25/006 |
| 2016/0379176 | A1* | 12/2016 | Brailovskiy | G06Q 30/0631 |
| | | | | 705/26.7 |
| 2019/0073179 | A1* | 3/2019 | Laidlaw | G09G 3/14 |
| 2020/0146118 | A1* | 5/2020 | Jansma | H05B 45/20 |
| 2020/0304328 | A1* | 9/2020 | Boemi | H04L 12/10 |

OTHER PUBLICATIONS

Notification of Transmittal of the International Search Report and the Written Opinion of the International Searching Authority, or the Declaration, PCT/EP2020/025401, dated Dec. 11, 2020, 14 pages.

* cited by examiner

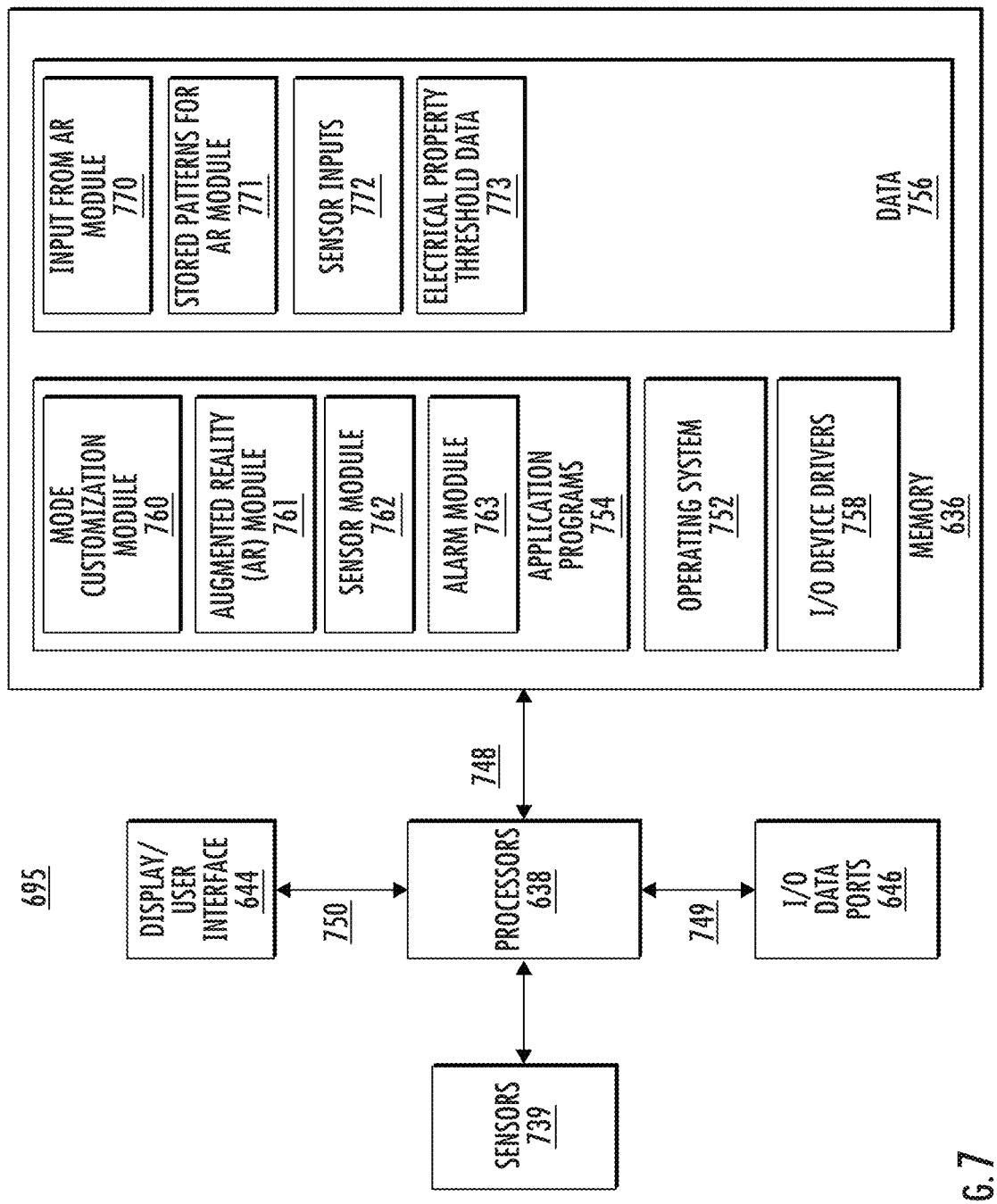

INTERACTIVE POWER DISTRIBUTION UNITS (PDUS) AND RELATED SYSTEMS

CLAIM OF PRIORITY

This application claims priority to U.S. Provisional Application No. 62/896,025, filed Sep. 5, 2019, entitled Interactive Power Distribution Units (PDUs) and related Outlets, the content of which is hereby incorporated herein in its entirety.

FIELD

The inventive concept relates generally to power distribution units (PDUs) and, more particularly, use of color indicators to convey information to provide interactive PDUs.

BACKGROUND

Currently power distribution units (PDUs) use colored light emitting diodes (LEDs) to convey certain information related to, for example, outlets thereof. For example, a solid red LED may communicate that the associated outlet is off and a solid green LED may indicate the associated outlet is on. Furthermore, a red or green flashing LED may be used to indicate, for example, exceeding a threshold or that a breaker has been tripped. However, beyond this simple communication, it is relatively difficult to discern information from just looking at the PDU.

SUMMARY

Some embodiments of the present inventive concept provide a power distribution unit (PDU) include a plurality of outlets; and a plurality of color indicators associated with a corresponding one of the plurality of outlets. Each of the plurality of color indicators being configured to produce a plurality of colors and each of the plurality of colors being uniquely associated with different properties of the PDU.

In further embodiments, the plurality of color indicators may be a plurality of light emitting diodes (LEDs) configured to emit a plurality of colors.

In still further embodiments, a group of the plurality of outlets may be identified by a same color LED associated with each of the plurality of outlets in the group.

In some embodiments, the plurality of LEDs may form a pattern of colored LEDs on the PDU. The pattern of colored LEDs may be indicative of a particular electrical property associated with the PDU. In certain embodiments, the electrical property may include current, voltage and/or power consumption.

In further embodiments, a number of the plurality of LEDs that are illuminated may be indicative of a particular electrical property associated with the PDU. In certain embodiments, the electrical property may be current, voltage and/or power consumption.

In still further embodiments, at least a portion of the plurality of LEDs may be configured to emit light to illuminate a portion of an equipment rack. The at least a portion of the plurality of LEDs may be configured to emit the light to illuminate a portion of the equipment rack responsive to a sensed condition in an environment where the PDU is located.

In some embodiments, a pattern in the plurality of LEDs on the PDU may be captured and compared to a series of stored patterns to determine a status of the PDU or a group of outlets associated with the PDU.

In further embodiments, the plurality of LEDs may be provided within a light channel associated with each of the plurality of outlets causing the outlet itself to illuminate.

In still further embodiments, the plurality of LEDs may be configured to blink to convey information related to the PDU.

In some embodiments, the plurality of LEDs may be configured to blink to communicate an overload, outlets among the plurality of outlets that are part of a same group and/or to facilitate location of a specific one or more of the plurality of outlets on the PDU.

Further embodiments of the present inventive concept provide a system for distributing power to devices including a power distribution unit (PDU). The PDU including a plurality of outlets; and a plurality of light emitting diodes (LEDs) associated with a corresponding one of the plurality of outlets. Each of the plurality of LEDs is configured to emit a plurality of colors and each of the plurality of colors is uniquely associated with different properties of the PDU.

In still further embodiments, the system may further include a plurality of sensors configured to sense at least one aspect of an environment where the PDU is positioned. The plurality of LEDs may operate responsive to communication from at least one of the plurality of sensors.

In some embodiments, the sensors may be a motion sensor, a vibration sensor, an ambient light sensor, a door contact sensor, and/or a temperature sensor.

In further embodiments, at least a portion of the plurality of LEDs may be configured to emit light to illuminate a portion of an equipment rack responsive to the communication from the at least one of the plurality of sensors.

In still further embodiments, the system may further include an augmented reality (AR) module configured to receive a screen capture of a current pattern of the plurality of LEDs on the PDU, compare the current pattern to known patterns and provide a status of the PDU based on the comparison.

BRIEF DESCRIPTION OF THE DRAWINGS

FIG. 7 is a more detailed block diagram of the data processing system in accordance with some embodiments of the present inventive concept.

DETAILED DESCRIPTION

Figure 1:
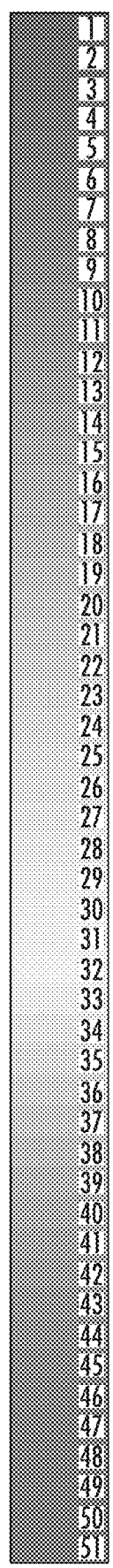
FIG. 1 is an example color gradient that may be used in accordance with some embodiments of the present inventive concept.

Specific example embodiments of the inventive concept now will be described with reference to the accompanying drawings. This inventive concept may, however, be embodied in many different forms and should not be construed as limited to the embodiments set forth herein; rather, these embodiments are provided so that this disclosure will be thorough and complete, and will fully convey the scope of the inventive concept to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive concept. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

As discussed above, historically light emitting diodes (LEDs) have been used primarily to indicate an on/off status of the outlets on the power distribution unit (PDUs). A PDU is a type of electrical component that distributes and manages electricity supply to computers, servers and networking devices within a data center environment. PDUs may provide a central unit to control and distribute electricity across the data center components. Conventionally, a solid red LED may communicate that the associated outlet is off and a solid green LED may indicate an associated outlet is on. A flashing LED may further indicate exceeding a threshold, a warning or that a breaker has been tripped. However, generally, it is difficult to discern information about the state of the PDU/outlet by just looking at the PDU itself. Some embodiments of the present inventive concept provide a color indicator capable of producing a multitude of colors associated with the PDU and/or the associated outlets to communicate more than just on/off and warning information as discussed above with respect to conventional systems.

As used herein, a "color indicator" refers to any kind of active (i.e. light emitting) or passive (light reflecting or translucent) color indicator that is capable of producing a multitude of colors. In other words, a color indicator may be an active light source or a passive (e.g. light reflecting or translucent) color indicator that is illuminated by an active light source such as daylight or back-lighting, and the like.

In some embodiments, the color indicator may be a red/green/blue (RGB) LED having the ability to convey many colors, the LEDs may be used to communicate more than just on/off and warning information in accordance with some embodiments of the present inventive concept. However, any type of color indicator capable of producing a plurality of colors may be used without departing from the scope of the present inventive concept. In embodiments using LEDs, the various colors of the RGB LEDs may be used to convey other information related to, for example, outlets on the PDU or the PDU as a whole. Accordingly, some embodiments of the present inventive concept provide devices, methods and systems that use color indicators/LEDs on the PDU to, for example, indicate, for example, current, voltage and/or power data in relation to other unit or outlet data; to indicate PDU data as a whole and for data communication purposes as will be discussed further below with respect to FIGS. 1 through 7.

As discussed above, although embodiments of the present inventive concept are discussed herein as having RGB LEDs associated with the outlets or PDUS, it will be understood that embodiments of the present inventive concept are not limited to this configuration. Other color indicators capable of producing a multitude of colors may be used without departing from the scope of the present inventive concept. For example, in some embodiments, the outlets themselves may be configured to emit light rather than associated LED.

As discussed above, it is difficult to discern information about the state of the PDU by just looking at the PDU itself. Providing displays, such as liquid crystal displays (LCDs) complicates the system as these displays are often cumbersome to navigate to find particular information on a relatively small screen. Accordingly, as discussed above, embodiments of the present inventive concept use LEDs on the PDU to convey information. In some embodiments of the inventive concept, additional data related to, for example, power health, may be revealed to a user/technician who may be walking past a PDU. In particular, some embodiments of the present inventive concept use Red/Green/Blue (RGB) outlet LEDs that may be included on the PDU, for example, Eaton High-Density (HD) Managed PDUs. The outlets may be, for example, metered, switched or managed without departing from the present inventive concept. These RGB LEDs can be mixed together to give a variety of colors for each outlet. An example color gradient of an RGB LED is provided in FIG. 1. It will be understood that the color gradient is provided in a grey scale herein as the figures are provided in black and white. However, it will be understood that in practice this gradient may be presented in color and may move from shades of blue (1) to green, yellow, orange and red (51) and the like. Any color gradient may be used without departing from the scope of the present inventive concept, thus, embodiments are not limited to the color gradient depicted in FIG. 1.

An example list of how the RGB LEDs can be used to convey information associated with the PDU outlets are provided below. It will be understood that this list is provided for example only and embodiments of the present inventive concept are not limited thereto.

(1) Default; a green color may indicate that the outlet is on and a red color may indicate that the outlet is off. Any colors may be used to indicate on/off without departing from the scope of the present inventive concept.

(2) International Electrotechnical Commission (IEC)-inspired; red indicates the outlet is on and green indicates the outlet is off.

(3) Feed identification, for example, same color as cover. In particular, the color may match a color-coded chassis or use the LED as primary identification for a power feed. In other words, in some embodiments, the chassis/cover may be black and an LED colors may be used as a way to identify status without the need for custom colors on the PDU itself.

When all the PDUs look the same physically, the LED color may be used to identify specific PDUs or groups of related PDUs.

(4) Phase/section identification (same color as section); again a group of PDUs that look physically the same may use different color LEDs to identify the phase or section to which the PDU belongs.

(5) Outlet current intensity/gradient (FIG. 1) with blue (1) indicating 0 Amps (A) and red (51) indicating a highest outlet current or user-defined current, from blue (1) to yellow (25) to red (51). As discussed above, FIG. 1 is provided in a grey scale, but a colored gradient may be used without departing from the scope of the present inventive concept. It will be understood that although current is used as an example herein, any electrical property of the PDU may be conveyed by the LED color without departing from the scope of the present inventive concept.

(6) Section current intensity/gradient (FIG. 1), with blue (1) indicating OA and red (51) indicating a highest section current or user-defined current, from blue (1) to yellow (25) to red (51).

(7) Power capacity vertical bar-graph for the whole-PDU, from bottom to top, with high-intensity white to indicate power; low-intensity white for outlet-on; off (no light) for outlet-off. For example, if a PDU is at 33% capacity, then on a 36 outlet PDU the bottom 12 outlets (one third of the 36) would be bright and the remaining would be dim. In some embodiments, the orientation for the "bottom" outlet can be triggered from an LCD orientation. Associated embodiments will be discussed below with respect to, for example, FIGS. 3A through 3F below.

(8) Game mode (e.g., pac-man, using LCD), song/flashing mode (e.g. like piano keys).

(9) Disco mode (based on PDU power intensity). Similar to game mode.

(10) Alternate between any of the two above modes every 3-5 seconds.

As discussed above, this items 1 through 10 of the list above is not intended to be exhaustive but is provided for example only. Furthermore, in some embodiments, the LEDs may also be configured to blink to indicate various of types of information related to the PDU. For example, a user may program an LED to blink responsive to a location request to locate a specific outlet or cause several outlets to blink to highlight specific Information Technology (IT) equipment that is part of a same group. It will also be understood that frequency at which the LEDs blink may be used to indicate certain information.

As used herein, an "electrical property" refers to any electrical property associated with an outlet or PDU that may convey information about the status of the outlet and/or PDU. For example, an electrical property may be electrical current, voltage, power and the like without departing from the scope of the present inventive concept.

Figure 2:
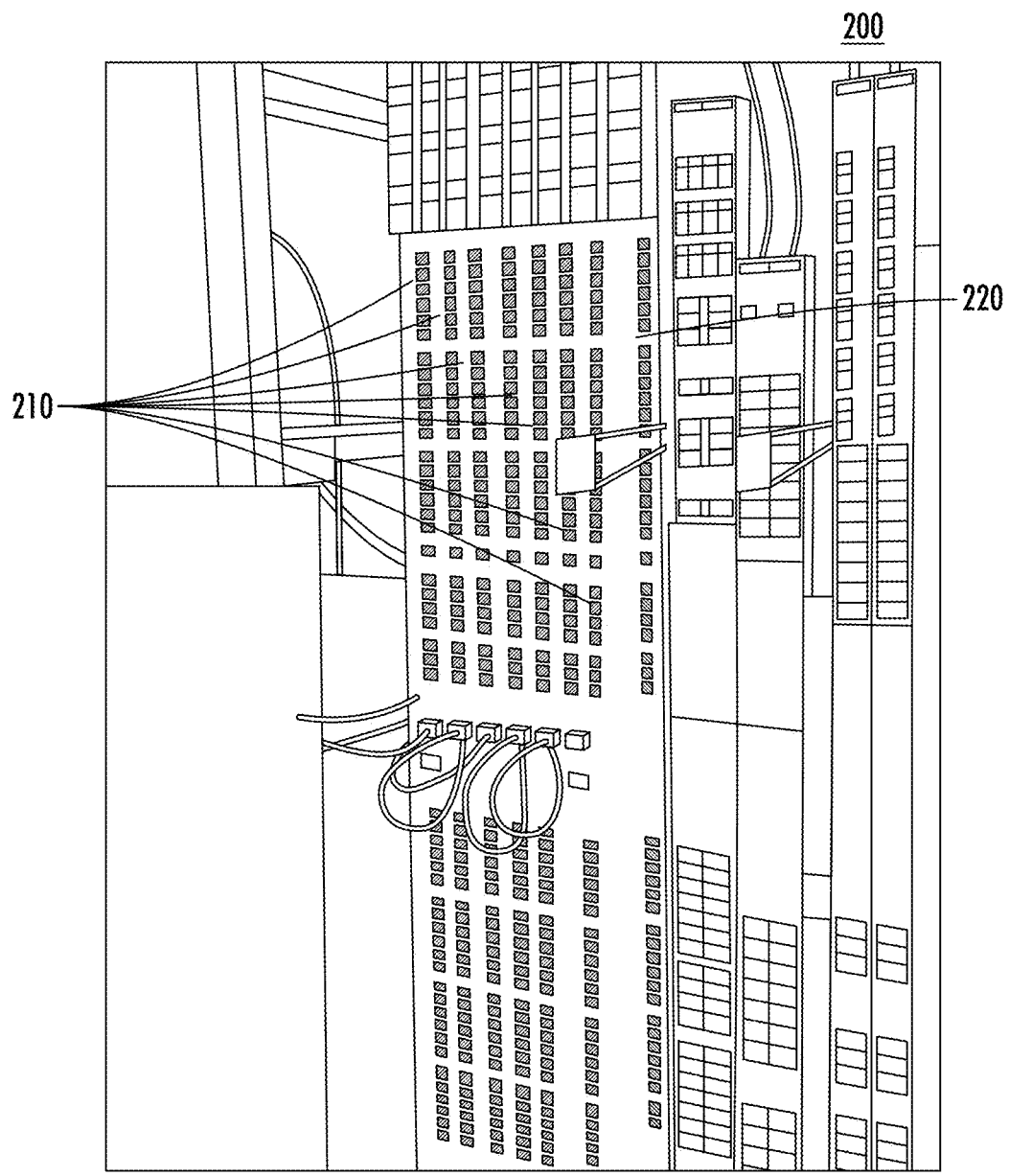
FIG. 2 is a diagram of a PDU including LEDs in accordance with some embodiments of the present inventive concept.
Figure 5:
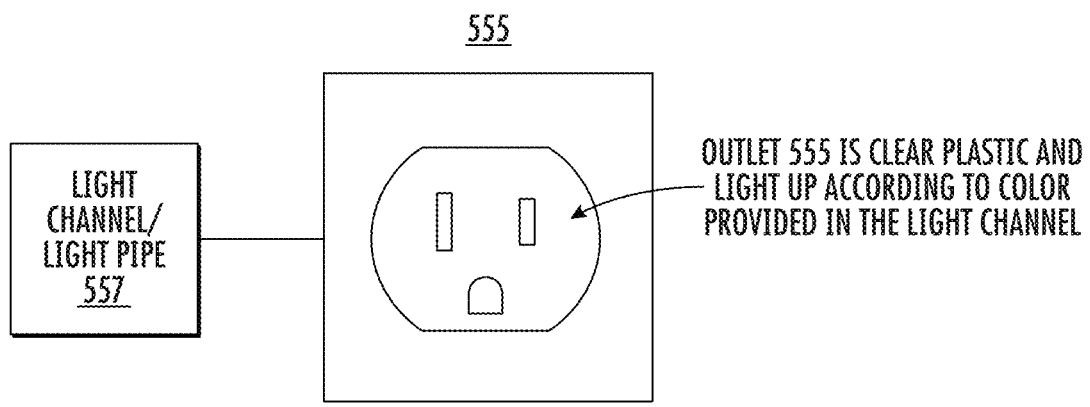
FIG. 5 is a diagram illustrating an outlet that is illuminated using a light channel/pipe in accordance with some embodiments of the present inventive concept.

Although embodiments of the present inventive concept discuss LEDs associated with each outlet, i.e. LEDs that are placed near the outlet as illustrated, for example, in FIG. 2, embodiments of the present inventive concept are not limited thereto. For example, in some embodiments, the LED may be moved inside the outlet to reduce space and enhance indication as illustrated in, for example, FIG. 5. As illustrated in FIG. 5, in these embodiments, the outlet 555 may be molded from a clear material and an LED light channel 557 may be created inside the outlet 55, in other words, the outlet 555 itself lights up. In further embodiments, a light pipe 557 may be inserted inside the outlet. Any method of associating light with the outlet 555 may be used without departing from the scope of the present inventive concept.

Although embodiments of the present inventive concept discuss the use of colored LEDs in various embodiments, white LEDs may also be used in various embodiments. For example, all of the LEDs may be white and may be used to illuminate portions of the rack, for example, a back side of the rack. Other color LEDs may also be used for illumination. Thus, embodiments of the present inventive concept are not necessarily limited to data displaying LEDs. For example, in some embodiments, sensors may be included on or near the PDUs to sense ambient light or motion and the LEDs may be switched on/or responsive to the sensed ambient light, a door contact sensor, or motion. For example, the motion sensors may sense a door into the room being opened and the LEDS illuminating the back side of the rack may be turned on responsive to the sensed movement of the door. It will be understood that the sensors may include light sensors, temperature sensors, contact sensors, motion sensors, vibration sensors and the like without departing from the scope of the present inventive concept.

In some embodiments of the present inventive concept, the LEDs on the PDU may be used to indicate, for example, current power consumption of the PDU. For example, a PDU typically has a maximum input power rating associated therewith. This power rating may be different for each PDU/outlet. Thus, the LED for each outlet may be used to make an "LED gauge" that indicates the current input power of the whole PDU. Thus, the current input power of the PDU may be communicated using the LEDs visually, rather than navigating through a menu on a smart device or on a remote webpage to get an overview of the input power.

Referring now to FIG. 2, a PDU 200 including LEDs in accordance with some embodiments of the present inventive concept will be discussed. As illustrated in FIG. 2, the PDU 200 includes a series of LEDs 210 and 220. Although not visible in the black and white figure, the LEDs 210 in the first seven columns (from left to right) are all one color and the LEDs 220 in the eighth column on the right is a different color. For example, the first seven columns 210 may include green LEDs and the eighth column 220 may include red LEDs. In these embodiments of the present inventive concept, the LEDs associated with the outlets are reused as a gauge. For example, the LEDs may be switched on from bottom to top (bottom to top) according to ratio of current power/max power. If all the LEDs are on, this may indicate 100 percent power usage. The colors of the LEDs may also be used to indicate electrical limits in some embodiments. In other words, a particular, unique color may be associated with each threshold for the electrical properties of the PDU/outlet. Thus, a user may assess these thresholds visually rather than using an LCD or similar communication device.

As used herein, "electrical limits" refer to thresholds, both upper and lower, associated with an outlet or PDU. These electrical limits may be associated with current, voltage, power and the like. Furthermore, although Referring now to FIGS. 3A through 3F, a series of PDUs with various LED configurations conveying information about the PDU will be discussed. The PDU of FIGS. 3A through 3F has a maximum input current of 32 A and 28 outlets, each outlet having 1.14 A of current or 4.08 percent of the total. It will be understood that these parameters are provided for example only and embodiments of the present inventive concept are not limited to this configuration.

Referring first to FIG. 3A, a normal mode of operation is illustrated. The LEDs indicate whether the outlet is ON or OFF, i.e. the status of the outlet. Although FIGS. 3A through 3F are shown in black and white, colors may also be used to indicate the status of the outlet. For example, green may indicate on and red may indicate off in some embodiments. FIGS. 3B through 3E illustrate, the total input current for 12 percent, 50 percent, 92 percent and 100 percent of the PDU rated current, respectively. In these embodiments, the number of the LEDs that are ON depends the total current (32 A) versus PDU rated current. It will be understood that in some embodiments colors may also be incorporated to convey information.

Figure 3:
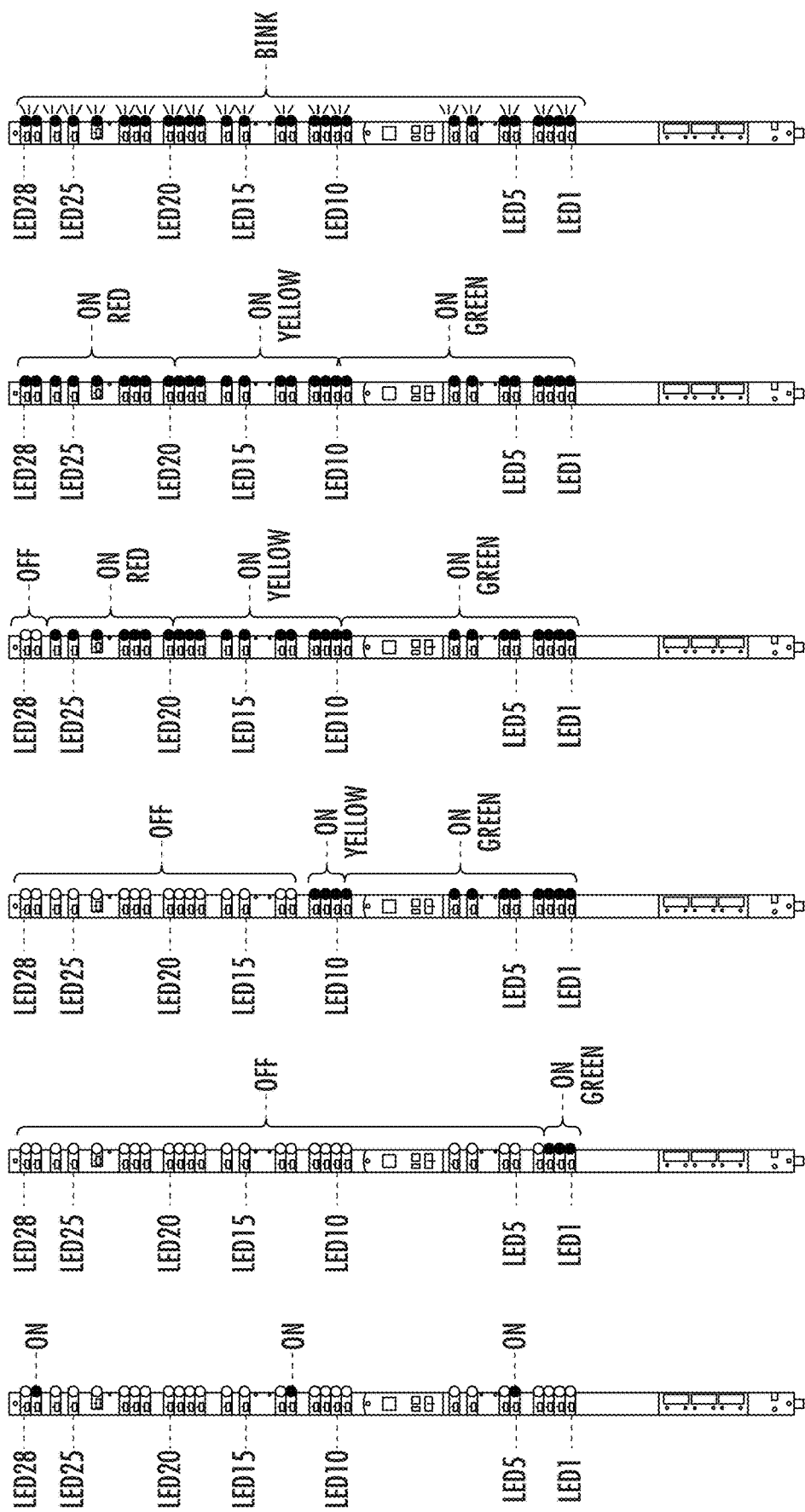
FIGS. 3A through 3F are PDUs having LEDs associated therewith, the pattern of the LEDs (on/off/color) indicating the load (current) of the PDU in accordance with some embodiments of the present inventive concept.
Figure 4:
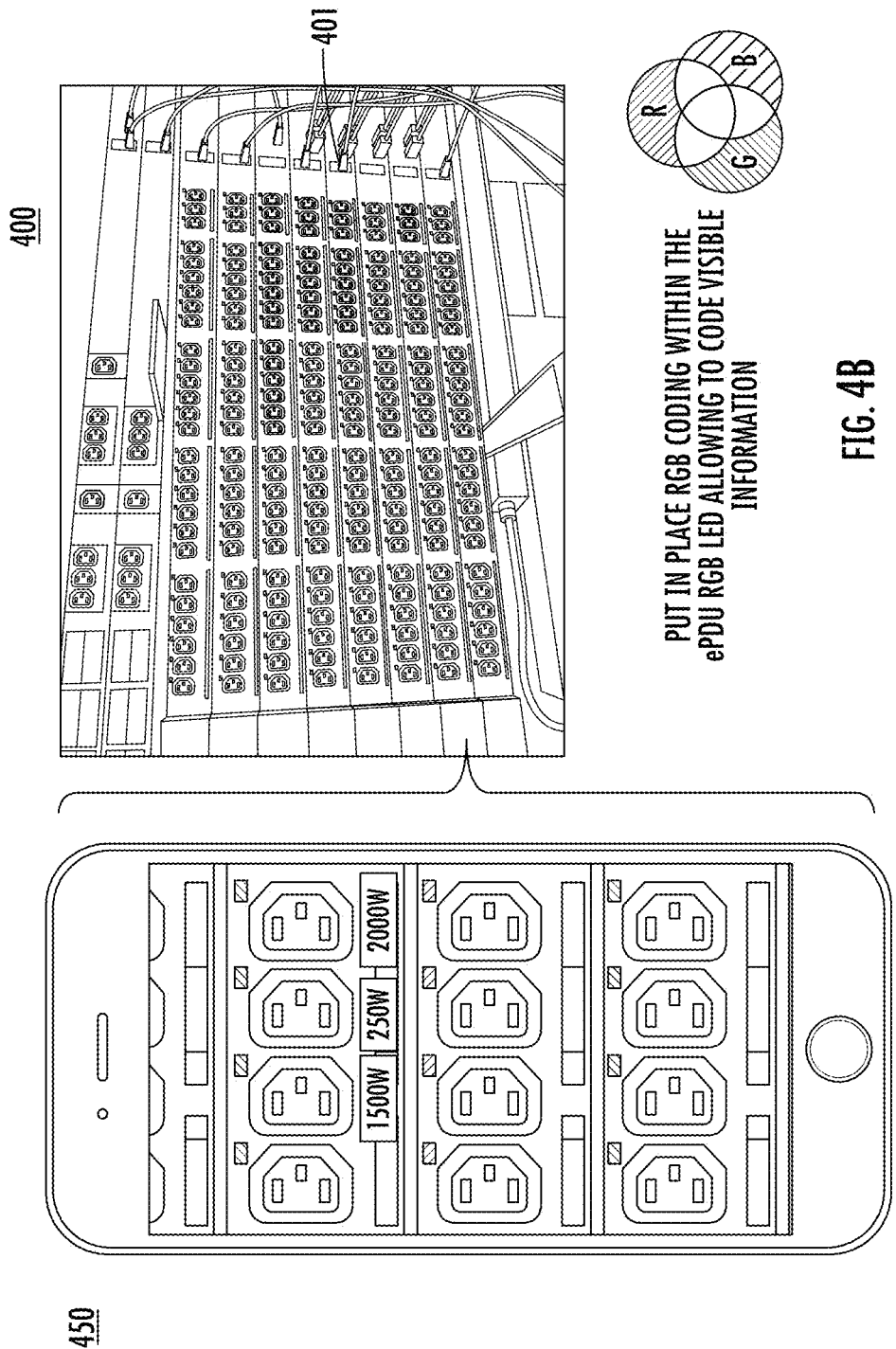
FIGS. 4A and 4B are diagrams of a portable electronic device and a PDU having LEDs, respectively, in accordance with some embodiments of the present inventive concept.

In particular, in FIG. 3B, 3 of the twenty-eight LEDs are ON and 25 of the LEDs are OFF. This indicates that the load is at 12 percent (3.9 A). In FIG. 3C, 14 of the twenty-eight LEDs are ON and 14 of the LEDs are OFF. This indicates that the load is at 50 percent (16 A). In FIG. 3D, 26 of the twenty-eight LEDs are ON and 2 of the LEDs are OFF. This indicates that the load is at 93 percent (29.71 A). In FIG. 3E, all twenty-eight LEDs are ON. This indicates that the load is at 100 percent (32 A). In FIG. 3F, the input current has exceeded the rated current. Thus, all 28 LEDs are on and blinking in this embodiment. However, other methods of conveying overload may be used without departing from the scope of the present inventive concept.

As discussed above, a color code may also be used to indicate warning, alarm alert. The PDU may have 3 color LEDs for each outlet. In some embodiments, a user may configure threshold percentages. For example, if consumption is less than 33 percent, green LEDs may be used. Orange (warning) LEDs may be used between 33 and 66 percent and red LEDs may be used for anything over 66 percent. At 100 percent, the LEDs may be configured to blink. The LED modes may be user customizable and may be set by the users using, for example, an LCD or webpage interface or application that is wireless enabled. The modes can be persistent, i.e. the mode stays the same or, in some embodiments, the modes may alternate between normal mode and power rating mode automatically or responsive to a command. When the mode is persistent, the user may have access to a live indicator of the total load during installation.

Some embodiments of the present inventive concept may use the LEDs in combination with augmented reality (AR) to monitor the PDU. As discussed above, the PDUs offered by Eaton include RGB LEDs, which are currently used for indicating the status of the outlet. Some embodiments of the present inventive concept use the full range of the RGB coding (through color variation) and by a picture processing application, for example, on a portable electronic device, to provide additional information using augmented reality as will be discussed with respect to FIGS. 4A and 4B.

Conventional systems allow the customer only visual basic information on the outlet status, for example, the outlet is on when the associated LED is green; the outlet is off when the associated LED is red and there is an alarm associated with the outlet when the LEDs are blinking. Some embodiments of the present inventive concept provide more information related outlet power consumption, outlet voltage, outlet current and the like by acquiring a real time PDU picture(s) and processing the picture(s) using, for example, a mobile application.

Referring now to FIGS. 4A and 4B, augmented reality embodiments will be discussed. As illustrated in FIGS. 4A and 4B, the system includes a PDU 400 having a plurality of LEDs thereon and a portable electronic device 450, for example, a mobile phone. In operation, a user may take a picture 401 of a current state of the LEDs on the PDU with the portable electronic device 450. It will be understood that the image may be captured in any way known to those of skill in the art. The picture 401 may be processed using algorithms to decode the RGB LEDs on the device 450 using AR to provide additional information related to the PDU. For example, the AR module 761 (FIG. 7 below) may be configured to compare the pattern of LEDs on the captured picture 401 to known patterns and provide status information associated with the PDU based on the comparison. It will be understood that embodiments of the present inventive concept are not limited to the example of FIGS. 4A and 4B. For example, the portable electronic device 450 may not actually take a picture but may only be used to capture the LEDs on the PDU in a window thereof, much like a scan. Furthermore, it will be understood that an RGB coding for the LEDs is established to allow coding of visible information. In other words, known patterns are established and stored so that the current status capture can be interpreted. In these embodiments, some color calibration may be needed between the PDU and the portable electronic device to enable these embodiments.

Figure 6:
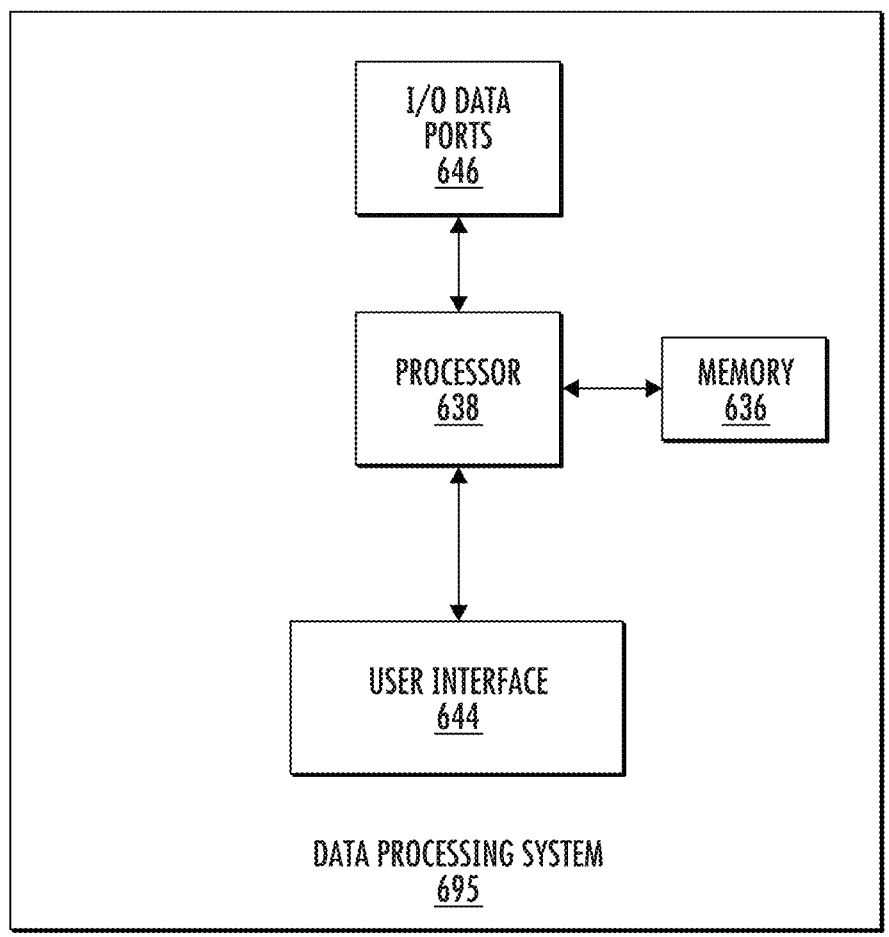
FIG. 6 is a block diagram illustrating a data processing system in accordance with various embodiments of the present inventive concept.

Referring now to FIG. 6, a block diagram of a data processing system 695 that may be used for processing the information in accordance with embodiments of the present inventive concept. For example, the data processing system may be used with AR embodiments to process data captured by the portable electronic device 450, to trigger an alarm based on the electrical properties of the system, to trigger an action responsive to sensed data or any other processing needed in accordance with some embodiments will be discussed. As illustrated in FIG. 6, the data processing system 695 may include a user interface 644, including, for example, input device(s) such as a man machine interface (MMI) including, but not limited to a keyboard or keypad and a touch screen; a display; a speaker and/or microphone; and a memory 636 that communicate with a processor 638. The data processing system 695 may further include I/O data port(s) 646 that also communicates with the processor 638. The I/O data ports 646 can be used to transfer information between the data processing system 695 and another computer system or a network, such as an Internet server, using, for example, an Internet Protocol (IP) connection. Some embodiments of the present inventive concept may be configured to interface with augmented reality headsets and the like. These components may be conventional components such as those used in many conventional data processing systems, which may be configured to operate as described herein.

Referring now to FIG. 7, a more detailed block diagram of a data processing system 695 of FIG. 6 is provided that illustrates details of modules in accordance with some embodiments of the present inventive concept will now be discussed. As illustrated in FIG. 7, the processor 638 communicates with the memory 636 via an address/data bus 748, the I/O data ports 646 via address/data bus 749 and the electronic display/user interface 644 via address/data bus 750. It will be understood that the communication over busses 748, 749 and 750 are not limited to wired communication, but could be wireless in accordance with some embodiments of the present inventive concept. Thus, it will be understood that FIG. 7 is provided for example only and that embodiments of the present inventive concept are not limited thereto.

Furthermore, the processor 638 can be any commercially available or custom enterprise, application, personal, pervasive and/or embedded microprocessor, microcontroller, digital signal processor or the like. The memory 636 may include any memory device containing the software and data used to implement the functionality of the data processing system 695. The memory 636 can include, but is not limited to, the following types of devices: ROM, PROM, EPROM, EEPROM, flash memory, SRAM, DRAM as well as storage in the cloud.

As further illustrated in FIG. 7, the memory 636 may include several categories of software and data used in the system: an operating system 752; application programs 754; input/output (I/O) device drivers 758; and data 756. As will be appreciated by those of skill in the art, the operating system 752 may be any operating system suitable for use with a data processing system, such as OS/2, AIX or zOS from International Business Machines Corporation, Armonk, N.Y., Windows95, Windows98, Windows2000 or WindowsXP, or Windows CE or Windows 7 from Microsoft Corporation, Redmond, Wash., Palm OS, Symbian OS, Cisco IOS, VxWorks, Unix or Linux and/or Android or IOS for mobile devices. The I/O device drivers 758 typically include software routines assessed through the operating system 752 by the application programs 754 to communicate with devices such as the I/O data port(s) 746 and certain memory 636 components. The application programs 754 are illustrative of the programs that implement the various features of some embodiments of the present inventive concept and may include at least one application that supports operations according to embodiments of the present inventive concept. Finally, as illustrated, the data 756 may include any of the data acquired and stored by the system, which may represent the static and dynamic data used by the application programs 754, the operating system 752, the I/O device drivers 758, and other software programs that may reside in the memory 636.

As illustrated in FIG. 7, the data 256 may include input from the AR module 770; stored patterns for the AR module 771; sensor input data 772 and electrical property threshold data 773. It will be understood that the data files provided in FIG. 7 are provided as examples only and that embodiments of the present inventive concept are not limited thereto. Two or more of the data files may be combined, one of the data files may be split in two or additional data files may be added without departing from the scope of the present inventive concept.

As further illustrated in FIG. 7, according to some embodiments of the present inventive concept, the application programs 254 include a mode customization module 760; an augmented reality module 761; a sensor module 762; and an alarm module 763. While the present inventive concept is illustrated with reference to the mode customization module 760; the AR module 761; the sensor module 762; and the alarm module 763 being application programs in FIG. 7, as will be appreciated by those of skill in the art, other configurations fall within the scope of the present inventive concept. For example, rather than being application programs 254, these circuits and modules may also be incorporated into the operating system 252 or other such logical division of the data processing system. Furthermore, while the mode customization module 760; the AR module 761; the sensor module 762; and the alarm module 763 are illustrated in a single system, as will be appreciated by those of skill in the art, such functionality may be distributed across one or more systems. Thus, the present inventive concept should not be construed as limited to the configuration illustrated in FIG. 7 but may be provided by other arrangements and/or divisions of functions between data processing systems. For example, although FIG. 7 is illustrated as having various circuits, one or more of these circuits may be combined without departing from the scope of the present inventive concept.

It will be understood that the mode customization module 760; the AR module 761; the sensor module 762; and the alarm module 763 may be used to implement various portions of the present inventive concept capable of being performed by a data processing system as will be discussed below.

As discussed above, LEDs may be utilized to communicate information about the PDUs and/or associated outlets in accordance with embodiments of the present inventive concept. The information conveyed may be customized based on the application, group/phase of PDUs, the customer and the like (mode customization module 760). In some embodiments, a current status of the LED on the PDU may be captured and interpreted by the AR module 761. The input 770 may be compared to the stored patterns 771 to determine information associated with the PDU/outlet.

As further discussed above, not all embodiments of the present inventive concept use the colors and patterns of the LEDs to convey specific data. For example, all white (as well as other colors) LEDs may be used to illuminate the back side of the rack. In some of these embodiments, sensors 739 may be used to sense movement, light etc. to determine if someone has entered the room and turn the LEDs on responsive thereto. (Sensor module 762, sensor inputs 772).

The alarm module 763 may be used to alert personnel to a problem indicated by the LEDs or the AR module 761. For example, if any of the thresholds for an individual outlet, group of outlets of the PDU as a whole exceeds a predetermined threshold 773, the alarm module 763 may be configured to sound the alarm to alert someone of a potential problem.

As discussed briefly above, embodiments of the present inventive concept utilized colored LEDs to provide more than basic on/off or alert data. The various colors may indicate groupings of LEDs, patterns may indicate usage of power or other electrical properties, blinking may indicate an overload and the like. Furthermore, some embodiments provide an AR embodiment that allows a currents status of the PDUs to be determined by capturing a pattern of LEDs on the PDU. Thus, some embodiments of the present inventive concept provide easier methods for interpreting status of PDUs and the associated outlets than conventional systems.

Example embodiments are described above with reference to block diagrams and/or flowchart illustrations of methods, devices, systems and/or computer program products. It is understood that a block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means (functionality) and/or structure for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the functions/acts specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, example embodiments may be implemented in hardware and/or in software (including firmware, resident software, micro-code, etc.). Furthermore, example embodiments may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Computer program code for carrying out operations of data processing systems discussed herein may be written in a high-level programming language, such as Java, AJAX (Asynchronous JavaScript), C, and/or C++, for development convenience. In addition, computer program code for carrying out operations of example embodiments may also be written in other programming languages, such as, but not limited to, interpreted languages. Some modules or routines may be written in assembly language or even micro-code to enhance performance and/or memory usage. However, embodiments are not limited to a particular programming language. It will be further appreciated that the functionality of any or all of the program modules may also be implemented using discrete hardware components, one or more application specific integrated circuits (ASICs), or a field programmable gate array (FPGA), or a programmed digital signal processor, a programmed logic controller (PLC), or microcontroller.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A power distribution unit (PDU) comprising:
a plurality of outlets; and
a plurality of colored indicators associated with a corresponding one of the plurality of outlets, each of the plurality of color indicators producing a plurality of colors and each of the plurality of colors being uniquely associated with different properties of the PDU;
wherein the plurality of color indicators comprise a plurality of light emitting diodes (LEDs) that emit a plurality of colors;
wherein the plurality of LEDs form a pattern of colored LEDs on the PDU and wherein the pattern of colored LEDs is indicative of a value of an electrical property associated with the PDU, wherein the electrical property comprises current, voltage and/or power consumption; and a unique color of the plurality of LEDs is associated with each threshold of upper and lower electrical limits of the electrical property.

2. The PDU of claim 1, wherein a group of the plurality of outlets are identified by a same color LED associated with each of the plurality of outlets in the group.

3. The PDU of claim 1, wherein a number of the plurality of LEDs that are illuminated is indicative of a value of the electrical property associated with the PDU, wherein the electrical property comprises current, voltage and/or power consumption.

4. The PDU of claim 1, wherein at least a portion of the plurality of LEDs emit light to illuminate a portion of an equipment rack.

5. The PDU of claim 4, wherein the at least a portion of the plurality of LEDs emit the light to illuminate a portion of the equipment rack responsive to a sensed condition in an environment where the PDU is located.

6. The PDU of claim 1, wherein a pattern in the plurality of LEDs on the PDU is captured and compared to a series of stored patterns to determine a status of the PDU or a group of outlets associated with the PDU.

7. The PDU of claim 1, wherein the plurality of LEDs are provided within a light channel associated with each of the plurality of outlets causing the outlet itself to illuminate.

8. The PDU of claim 1, wherein the plurality of LEDs are configured to blink to convey information related to the PDU.

9. The PDU of claim 8, wherein the plurality of LEDs are configured to blink to communicate an overload, outlets among the plurality of outlets that are part of a same group and/or to facilitate location of a specific one or more of the plurality of outlets on the PDU.

10. A system for distributing power to devices comprising:
a power distribution unit (PDU) comprising:
a plurality of outlets; and
a plurality of light emitting diodes (LEDs) associated with a corresponding one of the plurality of outlets, each of the plurality of LEDs emitting a plurality of colors and each of the plurality of colors being uniquely associated with different properties of the PDU, wherein the plurality of LEDs form a pattern of colored LEDs on the PDU and wherein the pattern of colored LEDs is indicative of a value of an electrical property associated with the PDU, wherein the electrical property comprises current, voltage and/or power consumption; and a unique color of the plurality of LEDs is associated with each threshold of upper and lower electrical limits of the electrical property.

11. The system of claim 10, further comprising a plurality of sensors configured to sense at least one aspect of an environment where the PDU is positioned, wherein the plurality of LEDs operate responsive to communication from at least one of the plurality of sensors.

12. The system of claim 11, wherein the sensors comprise a motion sensor, a vibration sensor, a contact sensor, an ambient light sensor and/or a temperature sensor.

13. The system of claim 11, wherein at least a portion of the plurality of LEDs are configured to emit light to illuminate a portion of an equipment rack responsive to the communication from the at least one of the plurality of sensors.

14. The system of claim 10, further comprising an augmented reality (AR) module configured to receive a screen capture of a current pattern of the plurality of LEDs on the PDU, compare the current pattern to known patterns and provide a status of the PDU based on the comparison.

15. The system of claim 10, wherein a group of the plurality of outlets are identified by a same color LED associated with each of the plurality of outlets in the group.

16. The system of claim 10, wherein a number of the plurality of LEDs that are illuminated is indicative of a value of the electrical property associated with the PDU, wherein the electrical property comprises current, voltage and/or power consumption.

17. The system of claim 10, wherein the plurality of LEDs are configured to blink to communicate an overload, outlets among the plurality of outlets that are part of a same group and/or to facilitate location of a specific one or more of the plurality of outlets on the PDU.

* * * * *

UNITED STATES PATENT AND TRADEMARK OFFICE
CERTIFICATE OF CORRECTION

| | |
|---|---|
| PATENT NO. | : 11,603,969 B2 |
| APPLICATION NO. | : 17/011656 |
| DATED | : March 14, 2023 |
| INVENTOR(S) | : Skorjanec et al. |

It is certified that error appears in the above-identified patent and that said Letters Patent is hereby corrected as shown below:

In the Specification

Column 5, Line 20: Please correct "indicating OA" to read -- including 0A --

Signed and Sealed this
Sixteenth Day of May, 2023

Katherine Kelly Vidal
*Director of the United States Patent and Trademark Office*